(12) United States Patent
Lin et al.

(10) Patent No.: US 10,238,018 B1
(45) Date of Patent: Mar. 19, 2019

(54) SHIELD STRUCTURES WITH REDUCED SPACING BETWEEN ADJACENT INSULATION COMPONENTS AND SYSTEMS AND METHODS FOR MAKING THE SAME

(71) Applicant: Apple Inc., Cupertino, CA (US)

(72) Inventors: Wei Lin, Santa Clara, CA (US); Nathan K. Gupta, San Francisco, CA (US); John Z. Zhong, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/836,424

(22) Filed: Dec. 8, 2017

Related U.S. Application Data

(60) Provisional application No. 62/556,441, filed on Sep. 10, 2017.

(51) Int. Cl.
    *H05K 9/00*           (2006.01)
    *H04M 1/02*           (2006.01)
    *H05K 7/04*           (2006.01)

(52) U.S. Cl.
    CPC .......... *H05K 9/0088* (2013.01); *H04M 1/026* (2013.01); *H05K 7/04* (2013.01); *H05K 9/0024* (2013.01)

(58) Field of Classification Search
    USPC .......................... 361/816, 818; 174/260–262
    See application file for complete search history.

(56) References Cited

U.S. PATENT DOCUMENTS

| | | | |
|---|---|---|---|
| 6,353,189 B1 * | 3/2002 | Shimada ............... | H01L 21/563 174/255 |
| 2007/0023902 A1 * | 2/2007 | Song ................... | H01L 23/5225 257/737 |

* cited by examiner

*Primary Examiner* — Hung S. Bui
(74) *Attorney, Agent, or Firm* — Van Court & Aldridge LLP

(57) ABSTRACT

Shield structures with reduced spacing between adjacent insulation components and systems and methods for making the same are provided. In some embodiments, different insulation components of different layers of a stack may be attached to the same surface of a shield component during a single attachment (e.g., lamination) operation to attenuate the spacing between the different insulation components attached to the shield component. Limiting the size of a spacing between adjacent insulation components along a shield component of a shield structure may limit the size of an exposed portion of the shield component, which may limit the opportunity for that exposed shield component portion to be shorted to another structure (e.g., a support structure of an electronic device that includes the shield structure).

13 Claims, 12 Drawing Sheets

SHIELD STRUCTURES WITH REDUCED SPACING BETWEEN ADJACENT INSULATION COMPONENTS AND SYSTEMS AND METHODS FOR MAKING THE SAME

CROSS-REFERENCE TO RELATED APPLICATION(S)

This application claims the benefit of prior filed U.S. Provisional Patent Application No. 62/556,441, filed Sep. 10, 2017, which is hereby incorporated by reference herein in its entirety.

TECHNICAL FIELD

This disclosure relates to shield structures and, more particularly, to shield structures with reduced spacing between adjacent insulation components and systems and methods for making the same.

BACKGROUND OF THE DISCLOSURE

A conventional shield structure may include a shield component and two or more insulation components along a surface of the shield component for insulating that shield component surface from another structure. However, the spacing between such insulation components along the shield component surface is often too large to meet certain functional requirements of the shield structure.

SUMMARY OF THE DISCLOSURE

Shield structures with reduced spacing between adjacent insulation components and systems and methods for making the same are provided.

As an example, a method is provided for forming an insulated shield structure for an electronic device using a shield component and a stack that includes a plurality of components, wherein the plurality of components includes a first insulation component and a second insulation component that is stacked above the first insulation component, the method including creating a cut through at least two components of the plurality of components of the stack, wherein the cut separates a first portion of the first insulation component from a second portion of the first insulation component, the cut separates a first portion of the second insulation component from a second portion of the second insulation component, the first portion of the second insulation component is stacked above the first portion of the first insulation component, and the second portion of the second insulation component is stacked above the second portion of the first insulation component, the method also including removing a first portion of the stack from a second portion of the stack, wherein the first portion of the stack includes the second portion of the first insulation component, and attaching a surface of the shield component to an exposed portion of the second portion of the stack, wherein the exposed portion of the second portion of the stack includes the first portion of the first insulation component and the second portion of the second insulation component.

As another example, an electronic device is provided that includes an electronic component and an insulated shield structure operative to shield the electronic component, wherein the insulated shield structure includes a shield component including a first shield component surface and a second shield component surface, a first insulation component attached to the first shield component surface, and a second insulation component attached to the first shield component surface, wherein a distance between a surface of the first insulation component and a surface of the second insulation component is less than 80 micrometers.

As yet another example, a method is provided for forming a multi-component structure using a base component and a stack that includes a plurality of stack components, wherein the plurality of stack components includes a first stack component and a second stack component that is stacked above the first stack component, the method including creating a cut through at least a portion of the stack, wherein the cut separates a first portion of the first stack component from a second portion of the first stack component, the cut separates a first portion of the second stack component from a second portion of the second stack component, the first portion of the second stack component is stacked above the first portion of the first stack component, and the second portion of the second stack component is stacked above the second portion of the first stack component, and the method also including joining a surface of the base component to the first portion of the first stack component and the second portion of the second stack component.

This Summary is provided only to present some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Unless otherwise stated, features described in the context of one example may be combined or used with features described in the context of one or more other examples. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which.

DETAILED DESCRIPTION OF THE DISCLOSURE

Shield structures with reduced spacing between adjacent insulation components and systems and methods for making the same are provided and described with reference to FIGS. 1-9.

Different insulation components of different layers of a stack may be attached to the same surface of a shield component during a single attachment (e.g., lamination) operation to attenuate the spacing between the different insulation components attached to the shield component. Limiting the size of a spacing between adjacent insulation components along a shield component of a shield structure may limit the size of an exposed portion of the shield component, which may limit the opportunity for that exposed shield component portion to be shorted to another structure (e.g., a support structure of an electronic device that includes the shield structure). The different insulation components may have different characteristics for enabling different functionalities of the shield structure. For example, a first insulation component (e.g., a pressure sensitive adhesive made from polyethylene terephthalate) may be better suited for adhering the shield structure to a support structure, while a second insulation component (e.g., a polyimide substrate) may be better suited for enabling a thermo-bonding process with the shield component of the shield structure.

Figure 1:
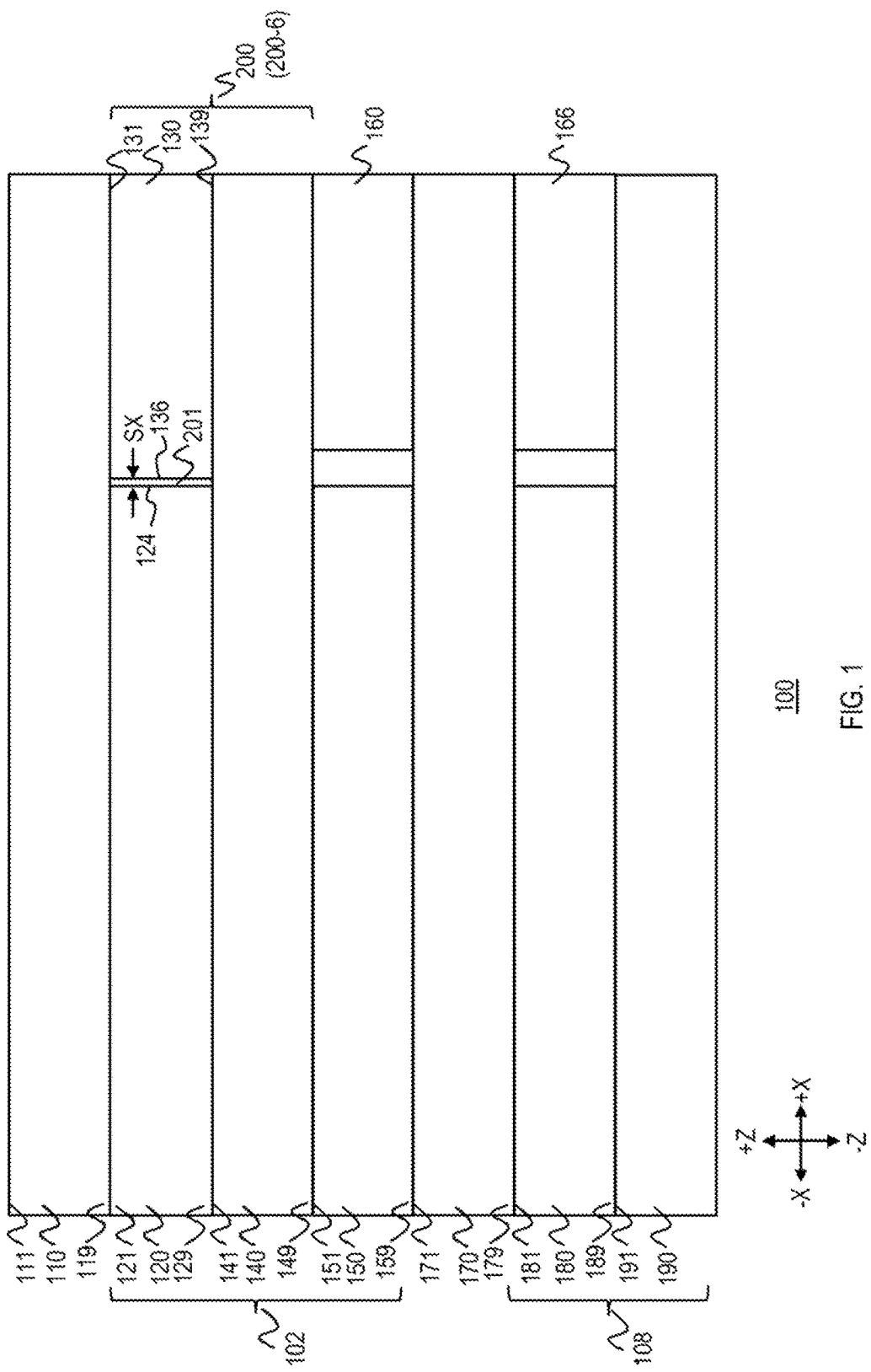
FIG. 1 is a cross-sectional view of an illustrative assembly that includes a shield structure with reduced spacing between adjacent insulation components.

A shield structure with reduced spacing between adjacent insulation components may be provided as part of any suitable electronic assembly. For example, as shown in FIG. 1, an electronic device assembly 100 may include an electronic component 170 and a shield structure 102 that may be operative to shield electronic component 170. Electronic component 170 may be any suitable component or collection of components that may generate and/or be susceptible to any electromagnetic fields (e.g., radio frequency ("RF") electromagnetic radiation and/or any other suitable electromagnetic interference ("EMI")), such as any suitable electronic sensor subassembly or circuit board or the like, while shield structure 102 may be any suitable component or collection of components that may be operative to create at least a portion of a barrier for blocking EMI from traveling towards or away from electronic component 170.

Shield structure 102 may include a shield component 140 positioned above and extending along at least a portion of a top surface 171 of electronic component 170, where shield component 140 may be any suitable component or combination of components that may be operative to create an EMI barrier, such as a conductive metal sheet (e.g., aluminum foil). Additionally, as shown, shield structure 102 may include a lower insulation component 150 positioned between and extending along at least a portion of a bottom surface 149 of shield component 140 and at least a portion of top surface 171 of electronic component 170, where lower insulation component 150 may be any suitable component or combination of components that may be operative to insulate shield component 140 from electronic component 170, such as a polyester core. Lower insulation component 150 may also include an adhesive layer along a top surface 151 for adhering lower insulation component 150 to bottom surface 149 of shield component 140 and/or an adhesive layer along a bottom surface 159 for adhering lower insulation component 150 to top surface 171 of electronic component 170.

Additionally or alternatively, as shown, shield structure 102 may include a first upper insulation component 120 positioned between and extending along a first portion of a top surface 141 of shield component 140 and a first portion of a bottom surface 119 of an assembly structure 110 opposite a top surface 111 of assembly structure 110 (e.g., any suitable support plate, such as a stainless steel mid plate or housing structure of an electronic device assembly 100), where upper insulation component 120 may be any suitable component or combination of components that may be operative to insulate shield component 140 from assembly structure 110, such as a polyester core. Upper insulation component 120 may also include an adhesive layer along a top surface 121 for adhering upper insulation component 120 to bottom surface 119 of assembly structure 110 and/or an adhesive layer along a bottom surface 129 for adhering upper insulation component 120 to top surface 141 of shield component 140. Shield structure 102 may also include a second upper insulation component 130 positioned between and extending along a second portion of top surface 141 of shield component 140 and a second portion of bottom surface 119 of assembly structure 110, where upper insulation component 130 may be any suitable component or combination of components that may be operative to insulate shield component 140 from assembly structure 110, such as a polyimide substrate. Upper insulation component 130 may also include an adhesive layer along a top surface 131 for adhering upper insulation component 130 to bottom surface 119 of assembly structure 110 and/or an adhesive layer along a bottom surface 139 for adhering upper insulation component 130 to top surface 141 of shield component 140. First and second insulation components 120 and 130 may have different characteristics for enabling different functionalities of shield structure 102. For example, first insulation component 120 (e.g., a pressure sensitive adhesive including a core made from polyethylene terephthalate) may be better suited for adhering shield structure 102 to assembly structure 110, while second insulation component 130 (e.g., a black polyimide tape including a polyimide core) may be better suited for enabling a thermo-bonding process with a portion of shield component 140 below second insulation component 130 (e.g., for grounding an interconnect component 160 that may be positioned between a portion of electronic component 170 and the portion of shield component 140 below second insulation component 130). In some embodiments, component 160 may be any suitable conductive component, such as any suitable conductive adhesive, that may be operative to form a conductive (e.g., grounding) path between electronic component 170 and shield component 140.

Additionally, as also shown in FIG. 1, assembly 100 may also include another shield structure 108 that may include a shield component 190, which may be positioned below and extending along at least a portion of a bottom surface 179 of electronic component 170, and an insulation component 180 that positioned between and extending along at least a portion of a top surface 191 of shield component 190 and at least a portion of bottom surface 179 of electronic component 170, where insulation component 180 may be any suitable component or combination of components that may be operative to insulate shield component 190 from electronic component 170, such as a polyester core. Insulation component 180 may also include an adhesive layer along a top surface 181 for adhering insulation component 180 to bottom surface 179 of electronic component 170 and/or an adhesive layer along a bottom surface 189 for adhering insulation component 180 to top surface 191 of shield component 190. An interconnect component 166 may be positioned between a portion of electronic component 170 and a portion of shield component 190. In some embodiments, component 166 may be any suitable conductive component, such as any suitable conductive adhesive, that may be operative to form a conductive (e.g., grounding) path between electronic component 170 and shield component 190.

As shown in FIG. 1, a spacing 201 of a magnitude SX (e.g., along an X-axis dimension) may exist between a side surface 124 of first insulation component 120 and a side surface 136 of second insulation component 130 when components 120 and 130 are positioned adjacent to one another on top surface 141 of shield component 140 of shield structure 102, where spacing 201 may expose a portion of top surface 141 of shield component 140 for potential shorting or other unfavorable electrical communication with bottom surface 119 of assembly structure 110. Therefore, in order to limit the possibility of such communication, magnitude SX of spacing 201 must be limited to a magnitude less than a particular magnitude (e.g., less than 80 micrometers, or less than 50 micrometers, or less than 30 micrometers, or less than 20 micrometers, or less than 10 micrometers). In some embodiments, first insulation component 120 of a desired geometry may be obtained and attached (e.g., laminated) to top surface 141 of shield component 140, and then second insulation component 130 of a desired geometry may be obtained and attached (e.g., laminated) to top surface 141 of shield component 140 at a position adjacent to first insulation component 120 that may result in an appropriately sized spacing 201. However, such an approach may expose magnitude SX of spacing 201 to various controlling dimensions (e.g., the cutting of the shape of component 120, the placement of component 120, the cutting of the shape of component 130, the placement of component 130, etc.) that may unfavorably increase the tolerance accumulation of magnitude SX beyond an acceptable magnitude. Therefore, other approaches may be more reliable for limiting the spacing between adjacent components on a base component, such as by attaching different insulation components from different stacked layers of a stack onto the same surface of a shield component, for example, in a single attachment operation (e.g., a single lamination operation).

As shown in FIGS. 2-7A, for example, a material stack 200 may be used in conjunction with shield component 140 to form at least a portion of shield structure 102 with reduced spacing between insulation component 120 and insulation component 130 along surface 141 of shield component 140. Although FIGS. 2-7A may be described with respect to a process for adjacently attaching two stacked insulation components on a shield component for forming an insulated shield structure, it is to be understood that such FIGS. 2-7A and such a process may be with respect to attaching any two stacked components in an adjacent manner on a surface of any base component for forming any suitable multi-component structure.

Figure 2:
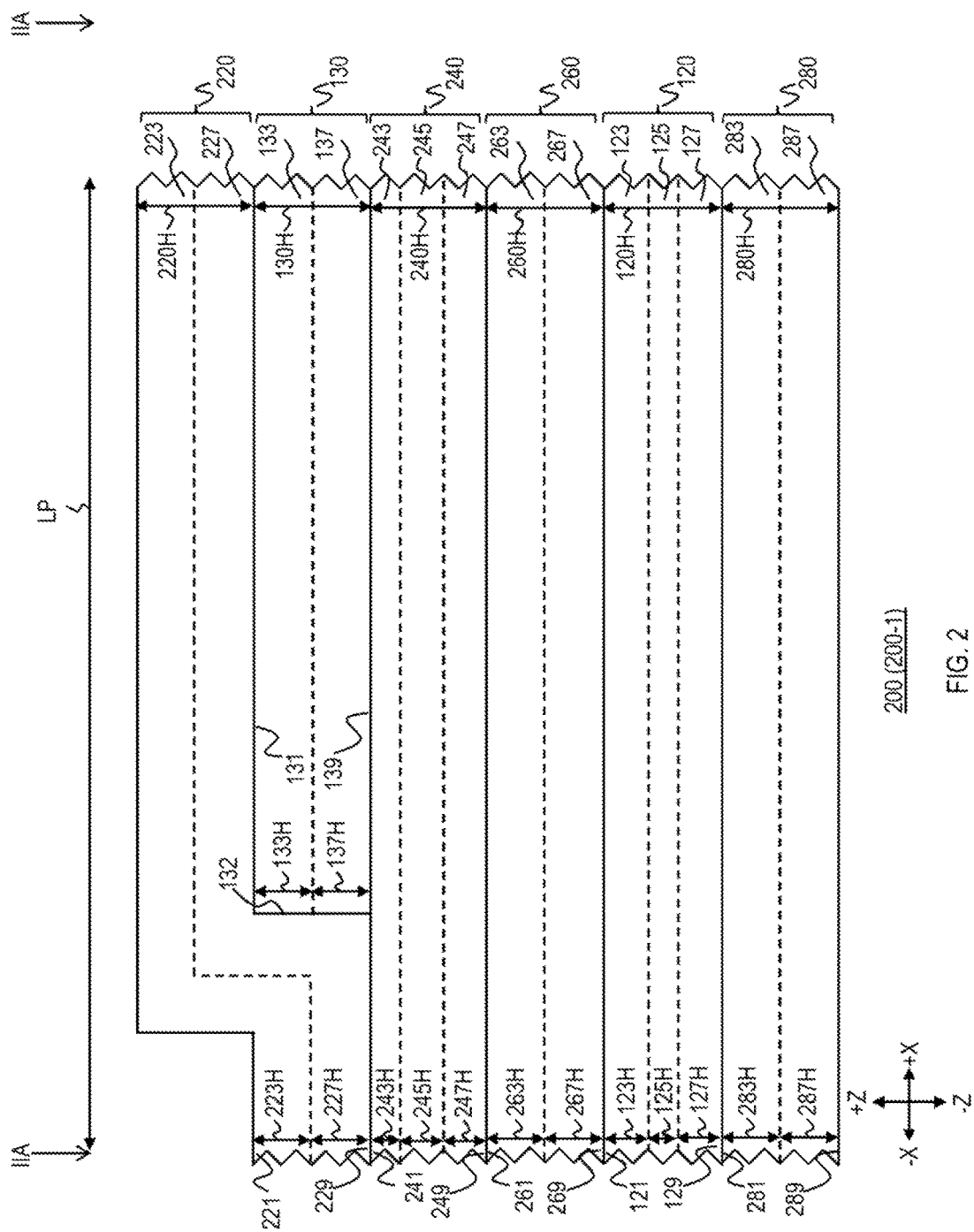
FIG. 2 is a cross-sectional view, similar to FIG. 1, of a portion of a material stack in a first stage of assembly of the shield structure of the assembly of FIG. 1, taken from line II-II of FIG. 2A.
Figure 2A:
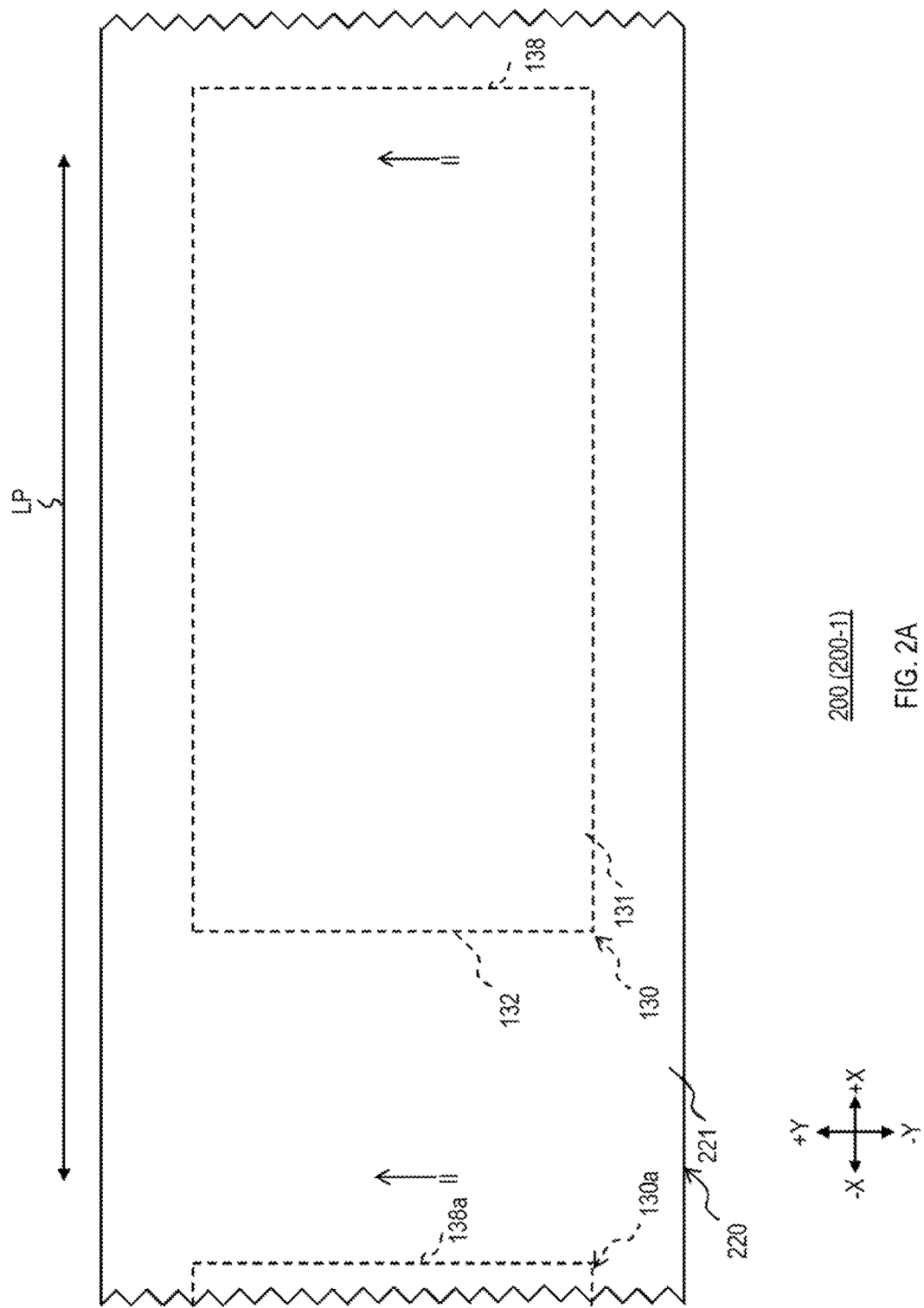
FIG. 2A is a top view of a portion of the material stack of FIG. 2, taken from line IIA-IIA of FIG. 2.

FIGS. 2 and 2A show stack 200 in a first stage of assembly of shield structure 102 (i.e., in a stage 200-1). Stack 200 may include any suitable number of any suitable stack components arranged in any suitable stacking order that includes at least first insulation component 120 and second insulation component 130. For example, as shown, stage 200-1 of stack 200 may include a carrier component 220, a buffer component 240, second insulation component 130 stacked in between a portion of a bottom surface 229 of carrier component 220 and a portion of a top surface 241 of buffer component 240, first insulation component 120, a first liner (e.g., heavy liner) component 260 stacked in between a bottom surface 249 of buffer component 240 and top surface 121 of first insulation component 120, and a second liner (e.g., light liner) component 280 stacked below first insulation component 120.

Second liner component 280 may be provided by any suitable material layer or combination of any suitable stacked material layers of any suitable height 280H between a top surface 281 and a bottom surface 289 in order to provide any suitable release liner that may be operative to protect but be harmlessly removed from an adhesive layer of component 120 (e.g., an adhesive layer 123) that may be positioned to extend above and along top surface 281 of liner component 280. For example, as shown, liner component 280 may include any suitable substrate layer 287 of any suitable height 287H that may define and extend upwards from bottom surface 289 and that may be made of any suitable material, such as a plastic (e.g., polyester (e.g., polyethylene terephthalate ("PET"))) or paper based substrate, in order to protect bottom surface 129 of component 120. Additionally, as shown, liner component 280 may include any suitable releasing agent layer 283 of any suitable height 283H that may define and extend downwards from top surface 281 and that may be made of any suitable material, such as a silicone, olephene, and/or acrylate releasing agent, in order to enable release of liner component 280 from an adhesive layer of component 120 (e.g., adhesive layer 123). Height 280H may be about 25 micrometers or may be in any suitable range, such as between 2 micrometers and 55 micrometers, while height 287H may be about 24 micrometers or may be in any suitable range, such as between 2 micrometers and 50 micrometers, while height 283H may be about 1 micrometer or may be in any suitable range, such as between 0.2 micrometers and 5.0 micrometers.

First insulation component 120 may be provided by any suitable material layer or combination of any suitable stacked material layers of any suitable height 120H between top surface 121 and bottom surface 129 in order to provide any suitable insulation that may be operative to insulate (e.g., from assembly structure 110) a portion of a shield component 140 that may be positioned to extend below and along bottom surface 129 of component 120 and/or to provide any suitable adhesion between bottom surface 129 of insulation component 120 and top surface 141 of shield component 140 and/or to provide any suitable adhesion between top surface 121 of insulation component 120 and bottom surface 119 of assembly structure 110 (e.g., a pressure sensitive adhesive). For example, as shown, insulation component 120 may include any suitable lower adhesive layer 127 of any suitable height 127H that may define and extend upwards from bottom surface 129 and that may be made of any suitable adhesive material, such as acrylate, polyurethane, silicone, or rubber-based pressure sensitive adhesive, in order to eventually adhere to top surface 141 of shield component 140. Additionally, as shown, insulation component 120 may include any suitable upper adhesive layer 123 of any suitable height 123H that may define and extend downwards from top surface 121 and that may be made of any suitable adhesive material, such as acrylate, polyurethane, silicone, or rubber-based pressure sensitive adhesive, in order to eventually adhere to bottom surface 119 of assembly structure 110. Additionally, as shown, insulation component 120 may include any suitable core layer 125 of any suitable height 125H that may extend between adhesive layers 123 and 127 and that may be made of any suitable core material, such as a polyester (e.g., PET) and/or paper-based and/or fabric and/or foam and/or metal foil based core, in order to eventually insulate (e.g., from assembly structure 110) a portion of a shield component 140. Height 120H may be about 25 micrometers or may be in any suitable range, such as between 1 micrometer and 800 micrometers or between 2 micrometers and 54 micrometers, while height 127H may be about 12 micrometers or may be in any suitable range, such as between 1 micrometer and 300 micrometers or between 1 micrometer and 25 micrometers, while height 125H may be about 1 micrometer or may be in any suitable range, such as between 1 micrometer and 200 micrometers or between 1 micrometer and 4 micrometers, and while height 123H may be about 12 micrometers or may be in any suitable range, such as between 1 micrometer and 300 micrometers or between 1 micrometer and 25 micrometers.

First liner component 260 may be provided by any suitable material layer or combination of any suitable stacked material layers of any suitable height 260H between a top surface 261 and a bottom surface 269 in order to provide any suitable release liner that may be operative to protect but be harmlessly removed from an adhesive layer of component 120 (e.g., adhesive layer 123) that may be positioned to extend below and along bottom surface 269 of liner component 260. For example, as shown, liner component 260 may include any suitable substrate layer 263 of any suitable height 263H that may define and extend downwards from top surface 261 and that may be made of any suitable material, such as a plastic (e.g., polyester (e.g., PET)) or paper based substrate, in order to protect top surface 121 of component 120. Additionally, as shown, liner component 260 may include any suitable releasing agent layer 267 of any suitable height 267H that may define and extend upwards from bottom surface 269 and that may be made of any suitable material, such as a silicone, olephene, and/or acrylate releasing agent, in order to enable release of liner component 260 from an adhesive layer of component 120 (e.g., adhesive layer 123). Height 260H may be about 25 micrometers or may be in any suitable range, such as between 2 micrometers and 55 micrometers, while height 263H may be about 24 micrometers or may be in any suitable range, such as between 2 micrometers and 50 micrometers, while height 267H may be about 1 micrometer or may be in any suitable range, such as between 0.2 micrometers and 5.0 micrometers. Alternatively, height 260H may be about 75 micrometers.

Buffer component 240 may be provided by any suitable material layer or combination of any suitable stacked material layers of any suitable height 240H between a top surface 241 and bottom surface 249 in order to provide any suitable adhesion between bottom surface 249 of buffer component 240 and top surface 261 of liner component 260 and/or to provide any suitable release liner that may be operative to protect but be harmlessly removed from an adhesive layer of component 130 (e.g., an adhesive layer 137) that may be positioned to extend above and along a portion of top surface 241 of buffer component 240 and/or to provide any suitable release liner that may be operative to protect but be harmlessly removed from an adhesive layer of carrier component 220 (e.g., an adhesive layer 227) that may be positioned to extend above and along another portion of top surface 241 of buffer component 240. For example, as shown, buffer component 240 may include any suitable lower adhesive layer 247 of any suitable height 247H that may define and extend upwards from bottom surface 249 and that may be made of any suitable adhesive material, such as acrylate, polyurethane, silicone, or rubber-based pressure sensitive adhesive or foam based adhesive, in order to adhere to top surface 261 of substrate layer 263 of liner component 260. Additionally, as shown, buffer component 240 may include any suitable releasing agent layer 243 of any suitable height 243H that may define and extend downwards from top surface 241 and that may be made of any suitable material, such as a silicone, olephene, and/or acrylate releasing agent, in order to enable release of buffer component 240 from an adhesive layer of component 130 (e.g., an adhesive layer 137) and/or in order to enable release of buffer component 240 from an adhesive layer of carrier component 220 (e.g., adhesive layer 227). Additionally, as shown, buffer component 240 may include any suitable substrate layer 245 of any suitable height 245H that may extend between adhesive layer 247 and releasing agent layer 243 and that may be made of any suitable material, such as a plastic (e.g., polyester (e.g., PET)) or paper based substrate, in order to provide any suitable robust structure to buffer component 240. Height 240H may be about 50 micrometers or may be in any suitable range, such as between 3 micrometers and 85 micrometers or between 4 micrometers and 14 micrometers, while height 247H may be about 30 micrometers or may be in any suitable range, such as between 1 micrometer and 30 micrometers or between 1 micrometer and 8 micrometers, while height 245H may be about 50 micrometers or may be in any suitable range, such as between 2 micrometers and 60 micrometers or between 3 micrometers and 10 micrometers, and while height 243H may be about 5 micrometers or may be in any suitable range, such as between 0.2 micrometers and 5.0 micrometers or between 0.5 micrometers and 2.0 micrometers.

Second insulation component 130 may be provided by any suitable material layer or combination of any suitable stacked material layers of any suitable height 130H between top surface 131 and bottom surface 139 in order to provide any suitable insulation that may be operative to insulate (e.g., from assembly structure 110) a portion of shield component 140 that may be positioned to extend below and along bottom surface 139 of component 130 and/or to enable any suitable thermo-bonding process with a portion of shield component 140 below component 130 (e.g., for grounding interconnect component 160 that may be positioned between a portion of electronic component 170 and the portion of shield component 140 below second insulation component 130). For example, as shown, insulation component 130 may include any suitable lower adhesive layer 137 of any suitable height 137H that may define and extend upwards from bottom surface 139 and that may be made of any suitable adhesive material, such as acrylate, polyurethane, silicone, or rubber-based pressure sensitive adhesive, in order to eventually adhere to top surface 141 of shield component 140. Additionally, as shown, insulation component 130 may include any suitable substrate layer 133 of any suitable height 133H that may extend downwards from top surface 131 and that may be made of any suitable substrate material, such as a polyimide substrate, in order to eventually insulate (e.g., from assembly structure 110) a portion of shield component 140 (e.g., as a black polyimide tape including a polyimide core). Height 130H may be about 20 micrometers or may be in any suitable range, such as between 6 micrometers and 200 micrometers or between 6 micrometers and 45 micrometers, while height 137H may be about 12 micrometers or may be in any suitable range, such as between 4 micrometers and 150 micrometers or between 4 micrometers and 30 micrometers, while height 133H may be about 8 micrometers or may be in any suitable range, such as between 2 micrometers and 50 micrometers or between 2 micrometers and 15 micrometers.

Carrier component 220 may be provided by any suitable material layer or combination of any suitable stacked material layers of any suitable height 220H between a top surface 221 and a bottom surface 229 in order to provide any suitable carrier structure that may be operative to carry some or all of the other components of stack 200 that may be positioned to extend below and along bottom surface 229 of carrier component 220 during the various stages of assembly of stack 200 (e.g., for forming shield structure 102), such as by adhering to insulation component 130 that may be positioned to extend below and along a portion of bottom surface 229 of carrier component 220 and/or by adhering to a portion of buffer component 240 that may be positioned to extend below and along another portion of bottom surface 229 of carrier component 220. For example, as shown, carrier component 220 may include any suitable lower adhesive layer 227 of any suitable height 227H that may define and extend upwards from bottom surface 229 and that may be made of any suitable adhesive material, such as acrylate, polyurethane, silicone, or rubber-based pressure sensitive adhesive and/or foam adhesive, in order to adhere to top surface 131 of insulation component 130 and/or in order to adhere to a portion of top surface 241 of buffer component 240. Additionally, as shown, carrier component 220 may include any suitable substrate layer 223 of any suitable height 223H that may extend downwards from top surface 221 and that may be made of any suitable substrate material, such as a polyester (e.g., PET) and/or a paper-based substrate, in order to eventually provide structure to one or more other portions of stack 200 during one or more stages of assembly (e.g., as a carrier film). Height 220H may be about 60 micrometers or may be in any suitable range, such as between 27 micrometers and 250 micrometers or between 53 micrometers and 85 micrometers, while height 227H may be about 55 micrometers or may be in any suitable range, such as between 25 micrometers and 200 micrometers or between 50 micrometers and 75 micrometers, while height 223H may be about 5 micrometers or may be in any suitable range, such as between 2 micrometers and 50 micrometers or between 3 micrometers and 10 micrometers.

One, some, or each of components 220, 240, 260, 120, and 280 of at least stage 200-1 of stack 200 may be provided to extend along any suitable length in the X-axis direction (e.g., a length including length portion LP of stack 200), while component 130 may only extend along a portion of that length (e.g., between surfaces 132 and 138, as shown in FIG. 2A in broken line under a transparently illustrated portion of component 220). Such a length may enable stack 200 to be used in any suitable conversion processing system, such as a roll-to-roll processing system or web processing system or reel-to-reel processing system or the like (e.g., in a +X rolling direction or in a −X rolling direction). As shown in FIG. 2A, two or more second insulation stack components, such as second insulation stack component 130 extending between surfaces 138 and 132, as well as another second insulation stack component 130a extending between surface 138a and another surface (not shown), such that a single stack 200 may be used to generate multiple shield structures. It is to be appreciated that various elements of assembly 100 and/or stack 200 may not be illustrated to scale and/or to exact geometry in one or more of FIGS. 1-7A in order to clearly show certain features thereof in a more efficient manner.

Figure 3:
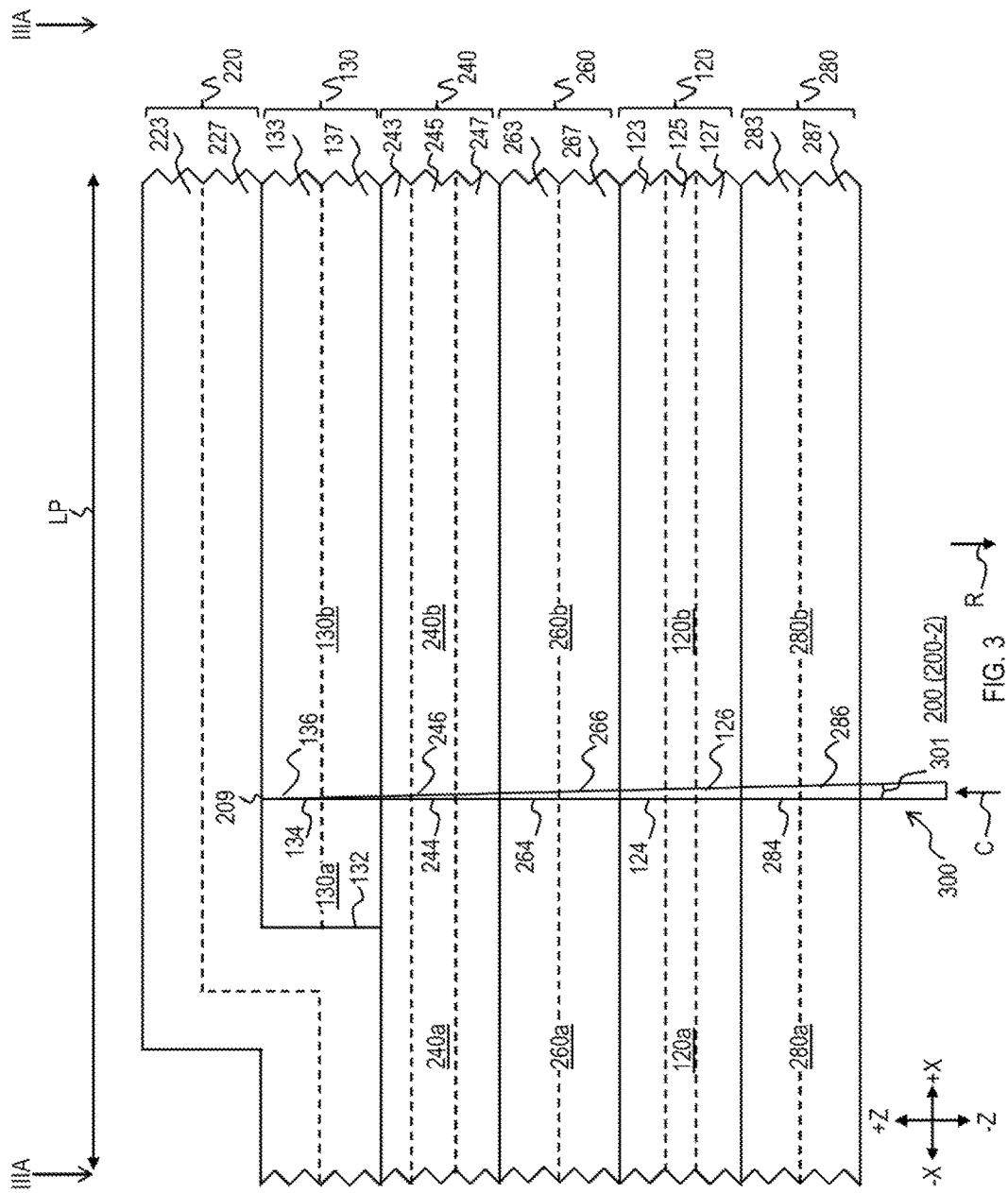
FIG. 3 is a cross-sectional view, similar to FIGS. 1 and 2, of a portion of the material stack of FIGS. 2 and 2A, in a second stage of assembly of the shield structure of the assembly of FIG. 1, taken from line of FIG. 3A.
Figure 3A:
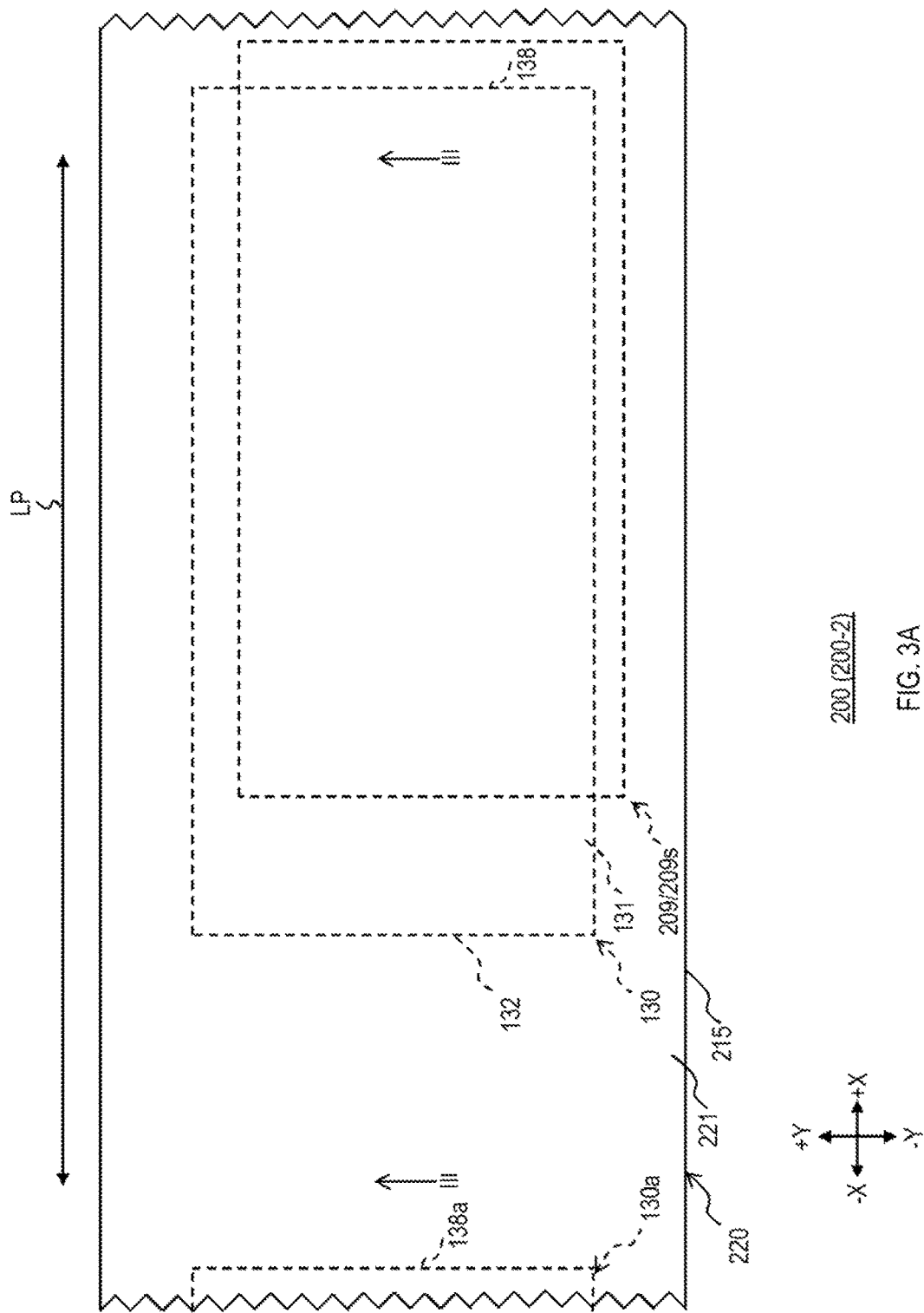
FIG. 3A is a top view, similar to FIG. 2A, of a portion of the material stack of FIGS. 2, 2A, and 3, taken from line IIIA-IIIA of FIG. 2.

Once material stack 200 has been formed in any suitable manner to be made available in its first stage of assembly 200-1, a cut may be created through at least a portion of stack 200, such as through at least two stack components, including, for example, through at least first insulation component 120 and second insulation component 130. FIGS. 3 and 3A show stack 200 in a second stage of assembly of shield structure 102 (i.e., in a stage 200-2), which may be the same as stage 200-1 of stack 200 but after a cut 209 has been made through at least a portion of stack 200 by a cutting mechanism 300. For example, cutting mechanism 300 may include a blade with a pierce cutting angle 301 (e.g., an angle of 10° or less than 5° or less than 10° or less than 15°) that may create cut 209 (e.g., in about or less than 0.2 seconds) or a laser that may create cut 209 (e.g., in about or less than 0.2 microseconds), where cut 209 may be a die cut or a kiss cut or any other suitable cut type in various embodiments. Cutting mechanism 300 may be operative to create cut 209 without removing any material from stack 200 (e.g., while a controlled tension is provided across stack 200 (e.g., along the X-axis direction)). Cut 209 may be made by introducing a blade or laser or any other suitable cutting feature of cutting mechanism 300 upwards through stack 200 in an upwards cutting direction of arrow C, which may be substantially perpendicular to the bottom surface of stack 200 and/or to the bottom surface of one or more material layers of stack 200 (e.g., in the +Z direction, where the stacking of stacked components of stack 200 may be along the Z-axis), and then through removal of the cutting feature from stack 200 in a downwards removal direction of arrow R, although it is to be understood that the cutting direction and/or removal direction may form any other suitable angle with respect to stack 200.

As shown in FIG. 3, cut 209 may be provided through liner component 280, through insulation component 120, through liner component 260, through buffer component 240, and through insulation component 130, but not through carrier component 220 (e.g., such that carrier component 220 may maintain its ability to carry stack 200 through future stages of assembly). Cut 209 may be provided through the entirety of liner component 280 between bottom surface 289 and top surface 281 for separating liner component 280 into a first liner component portion 280a, which may include an exposed side surface 284, and a second liner component portion 280b, which may include an exposed side surface 286 that may face exposed side surface 284 on an opposing side of cut 209. Cut 209 may be provided through the entirety of insulation component 120 between bottom surface 129 and top surface 121 for separating insulation component 120 into a first insulation component portion 120a, which may include an exposed side surface 124, and a second insulation component portion 120b, which may include an exposed side surface 126 that may face exposed side surface 124 on an opposing side of cut 209. Cut 209 may be provided through the entirety of liner component 260 between bottom surface 269 and top surface 261 for separating liner component 260 into a first liner component portion 260a, which may include an exposed side surface 264, and a second liner component portion 260b, which may include an exposed side surface 266 that may face exposed side surface 264 on an opposing side of cut 209. Cut 209 may be provided through the entirety of buffer component 240 between bottom surface 249 and top surface 241 for separating buffer component 240 into a first buffer component portion 240a, which may include an exposed side surface 244, and a second buffer component portion 240b, which may include an exposed side surface 246 that may face exposed side surface 244 on an opposing side of cut 209. Cut 209 may also be provided through the entirety of insulation component 130 between bottom surface 139 and top surface 131 for separating insulation component 130 into a first insulation component portion 130a, which may include an exposed side surface 134, and a second insulation component portion 130b, which may include an exposed side surface 136 that may face exposed side surface 134 on an opposing side of cut 209. As shown, first component portion 130a may be stacked above first component portion 240a, which may be stacked above first component portion 260a, which may be stacked above first component portion 120a, which may be stacked above first component portion 280a, while second component portion 130b may be stacked above second component portion 240b, which may be stacked above second component portion 260b, which may be stacked above second component portion 120b, which may be stacked above second component portion 280b.

Cut 209 may be created to define any suitable cut shape about a portion of stack 200. For example, as shown in FIG. 3A (e.g., in broken line under a transparently illustrated portion of component 220), a horizontal cross-section cut shape 209s of cut 209 through stack 200 below carrier component 220 (e.g., through component 280 and/or component 120 and/or component 260 and/or component 240 and/or component 130) may be rectangular, although any other suitable shape 209s may be provided by cut 209. As shown in FIG. 3A by cut shape 209s, only a portion of cut 209 may be provided through component 130, while another portion of cut 209 may be provided through a portion of stack 200 that does not include component 130. Alternatively, in other embodiments, the entirety of cut shape 209s of cut 209 may be provided within the bounds of component 130 within stack 200. Alternatively, in some embodiments, cut shape 209s may not be a closed shape, but instead cut 209 may extend to an edge of stack 200 (e.g., all the way to the −Y edge 215 of stack 200).

Figure 4:
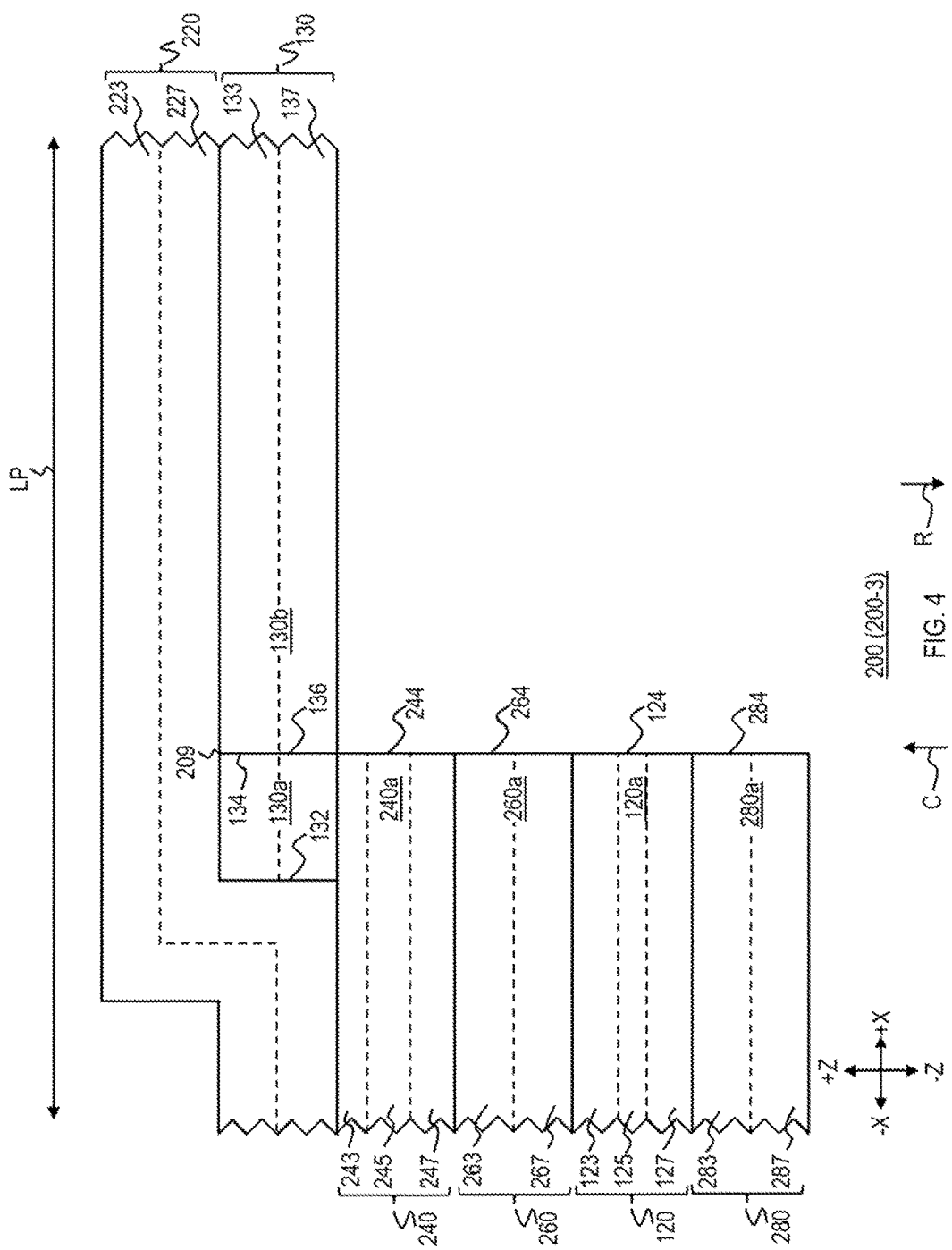
FIG. 4 is a cross-sectional view, similar to FIGS. 1, 2, and 3, of a portion of the material stack of FIGS. 2-3A, in a third stage of assembly of the shield structure of the assembly of FIG. 1.

Once material stack 200 has been cut to be made available in its second stage of assembly 200-2, a portion of stack 200 that may be at least partially defined by or bound by the cut, which may include a portion of insulation component 120, may be removed from the stack. FIG. 4 shows stack 200 in a third stage of assembly of shield structure 102 (i.e., in a stage 200-3), which may be the same as stage 200-2 of stack 200 but after a portion of stack 200 has been removed from another portion of stack 200 through any suitable removal process. For example, as shown, a first portion of stack 200 of stage 200-2, which may include second component portion 240b and second component portion 260b and second component portion 120b and second component portion 280b, may be removed (e.g., in the removal direction of arrow R) from a second portion of stack 200 of stage 200-2, which may include carrier component 220 and first component portion 130a and second component portion 130b and first component portion 240a and first component portion 260a and first component portion 120a and first component portion 280a, such that stack 200 of stage 200-3 may only include that remaining second portion of stack 200. Therefore, in some embodiments, the stack portion removed from stack 200 to provide stage 200-3 may be the portion of the stack separated from another portion of the stack by cut 209, except for the separated portions of insulation component 130.

The stack portion removal process for providing stage 200-3 may be accomplished using any suitable technique(s), including any suitable scraping process. Removal of the stack portion may be accomplished without affecting the geometry of the remaining stack portion. Stack 200 may be configured such that the release force required (e.g., in the direction of arrow R) to remove buffer component 240 from insulation component 130 may be less than the release force required (e.g., in the direction of arrow R) to remove insulation component 130 from carrier component 220, such that second component portion 130b may remain as a portion of stack 200 of stage 200-3 despite that second component portion 130b being stacked above the stack portion that was removed from stack 200 (e.g., the release force that may be required to release adhesive layer 227 of bottom surface 229 of carrier component 220 from substrate layer 133 of top surface 131 of insulation component 130 may be greater (e.g., 20-100 times greater) than the release force that may be required to release releasing agent layer 243 of top surface 241 of buffer component 240 from adhesive layer 137 of bottom surface 139 of insulation component 130).

Figure 5:
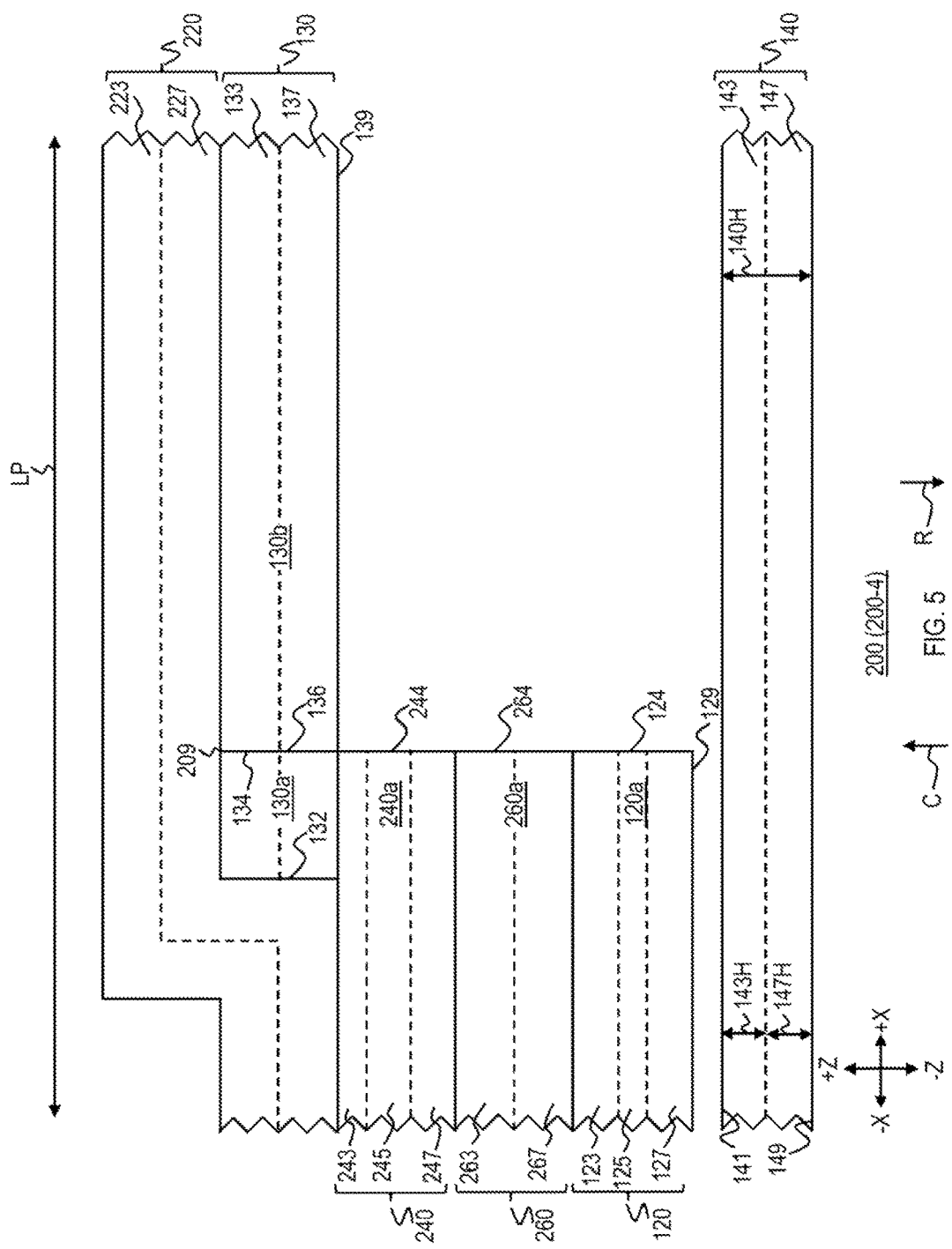
FIG. 5 is a cross-sectional view, similar to FIGS. 1, 2, 3, and 4, of a portion of the material stack of FIGS. 2-4, in a fourth stage of assembly of the shield structure of the assembly of FIG. 1.

Once a stack portion has been removed from material stack 200 to provide stack 200 in its third stage of assembly 200-3, another portion of stack 200 may be removed from the stack in order to prepare the stack for attachment to a shield component. FIG. 5 shows stack 200 in a fourth stage of assembly of shield structure 102 (i.e., in a stage 200-4), which may be the same as stage 200-3 of stack 200 but after another portion of stack 200 has been removed through any suitable removal process. For example, as shown, first component portion 280a of liner component 280 may be removed (e.g., in the removal direction of arrow R) from the remainder of stack 200 of stage 200-3, such that adhesive layer 127 of bottom surface 129 of insulation component 120 may be exposed. The stack portion removal process for providing stage 200-4 may be accomplished using any suitable technique(s), including any suitable scraping process. Removal of first component portion 280a of liner component 280 may be accomplished without affecting the geometry of the remaining stack portion. Stack 200 may be configured such that the release force required (e.g., in the direction of arrow R) to remove first component portion 280a of liner component 280 from first component portion 120a of insulation component 120 may be less than the release force required (e.g., in the direction of arrow R) to remove first component portion 120a of insulation component 120 from first component portion 260a of liner component 260, such that first component portion 120a may remain as a portion of stack 200 of stage 200-4 despite that first component portion 120a being stacked above the stack portion that was removed from stack 200 (e.g., the release force that may be required to release adhesive layer 123 of top surface 121 of first component portion 120a of insulation component 120 from releasing agent layer 267 of bottom surface 269 of first component portion 260a of liner component 260 may be greater (e.g., 2-5 times greater) than the release force that may be required to release adhesive layer 127 of bottom surface 129 of first component portion 120a of insulation component 120 from releasing agent layer 283 of top surface 281 of first component portion 280a of liner component 280).

Figure 6:
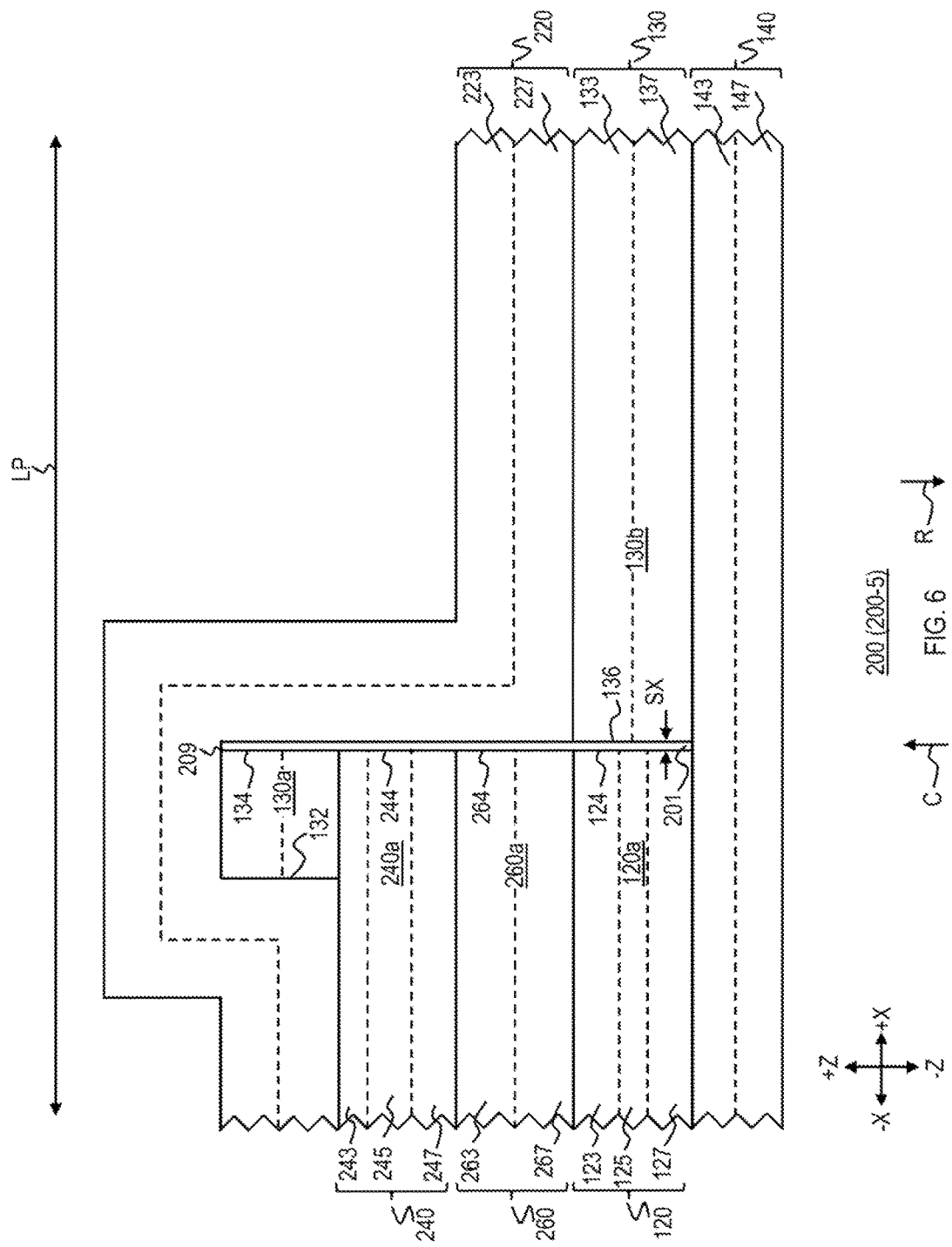
FIG. 6 is a cross-sectional view, similar to FIGS. 1, 2, 3, 4, and 5, of a portion of the material stack of FIGS. 2-5, in a fifth stage of assembly of the shield structure of the assembly of FIG. 1.

Once each appropriate stack portion has been removed from material stack 200 to provide stack 200 in its fourth stage of assembly 200-4, a surface of a base component, such as top surface 141 of shield component 140, may be positioned under stack 200 (e.g., as shown in FIG. 5) and then an exposed portion of stack 200 may be attached to the base component. FIG. 6 shows stack 200 in a fifth stage of assembly of shield structure 102 (i.e., in a stage 200-5), which may be the same as stage 200-4 of stack 200 but after top surface 141 of shield component 140 has been attached to stack 200. Shield component 140 may be provided by any suitable material layer or combination of any suitable stacked material layers of any suitable height 140H between top surface 141 and bottom surface 149 in order to provide any suitable base structure that may be operative to be insulated by insulation components 120 and 130 and that may be operative to create an EMI barrier (e.g., between assembly structure 110 and electronic component 170 of assembly 100). For example, as shown, shield component 140 may include any suitable lower layer 147 of any suitable height 147H that may define and extend upwards from bottom surface 149 and that may be made of any suitable shield material, such as an aluminum foil, in order to eventually shield electronic component 170. Additionally, as shown, shield component 140 may include any suitable top layer 143 of any suitable height 143H that may define and/or extend downwards from top surface 141 and that may be made of any suitable substrate material, such as a PET film or polyimide film (e.g., by direct coating or lamination on layer 147). Height 140H may be about 20 micrometers or may be in any suitable range, such as between 8 micrometers and 150 micrometers or between 12 micrometers and 35 micrometers, while height 147H may be about 16 micrometers or may be in any suitable range, such as between 8 micrometers and 100 micrometers or between 12 micrometers and 25 micrometers, while height 143H may be about 4 micrometers or may be in any suitable range, such as between 0 micrometers and 50 micrometers or between 0 micrometers and 10 micrometers.

As shown in FIG. 6, top surface 141 of shield component 140 may be attached to an exposed (e.g., bottom) portion of stage 200-4 of stack 200 to provide stage 200-5 of stack 200, where such an exposed portion of stack 200 may include first portion 120a of insulation component 120 (e.g., bottom surface 129 of lower adhesive layer 127 of first portion 120a of insulation component 120) and second portion 130b of insulation component 130 (e.g., bottom surface 139 of adhesive layer 137 of second portion 130b of insulation component 130). The attachment process for providing stage 200-5 may be accomplished using any suitable technique(s), including any suitable laminating process. For example, a first portion of top surface 141 of shield component 140 may be pressed against bottom surface 129 of lower adhesive layer 127 of first portion 120a of insulation component 120 while a second portion of top surface 141 of shield component 140 may be pressed against bottom surface 139 of adhesive layer 137 of second portion 130b of insulation component 130, for example, by using set of rollers that may be heated or otherwise for joining stage 200-4 of stack 200 to top surface 141 of shield component 140 for providing stage 200-5 of stack 200. The attachment of stack 200 to shield component 140 may be accomplished during a single attachment operation (e.g., a single lamination operation (e.g., a single pass through of stack 200 and shield component 140 between a set of rollers)). As just one example, each roller may be a rubber roller (e.g., with a durometer of 70 Shore A) and the rollers may apply any suitable pressure (e.g., a pressure in a range of 0.3 megapascals to 2.0 megapascals or about 0.65 megapascals) on stack 200 and shield component 140 (e.g., on top surface 221 of carrier component 220 (e.g., in the direction of arrow R) and bottom surface 149 of shield component 140 (e.g., in the direction of arrow C)) to provide stage 200-5 of stack 200. A deformable (e.g., rubber) roller may be provided to roll along top surface 221 of carrier component 220 (e.g., along the +X-direction) to constantly push stage 200-4 of stack 200 against shield component 140 for providing stage 200-5 of stack 200. Carrier component 220 may be operative to stretch (e.g., in the −Z direction) during the attachment process to press bottom surface 139 of adhesive layer 137 of second portion 130b of insulation component 130 against top surface 141 of shield component 140.

Figure 7:
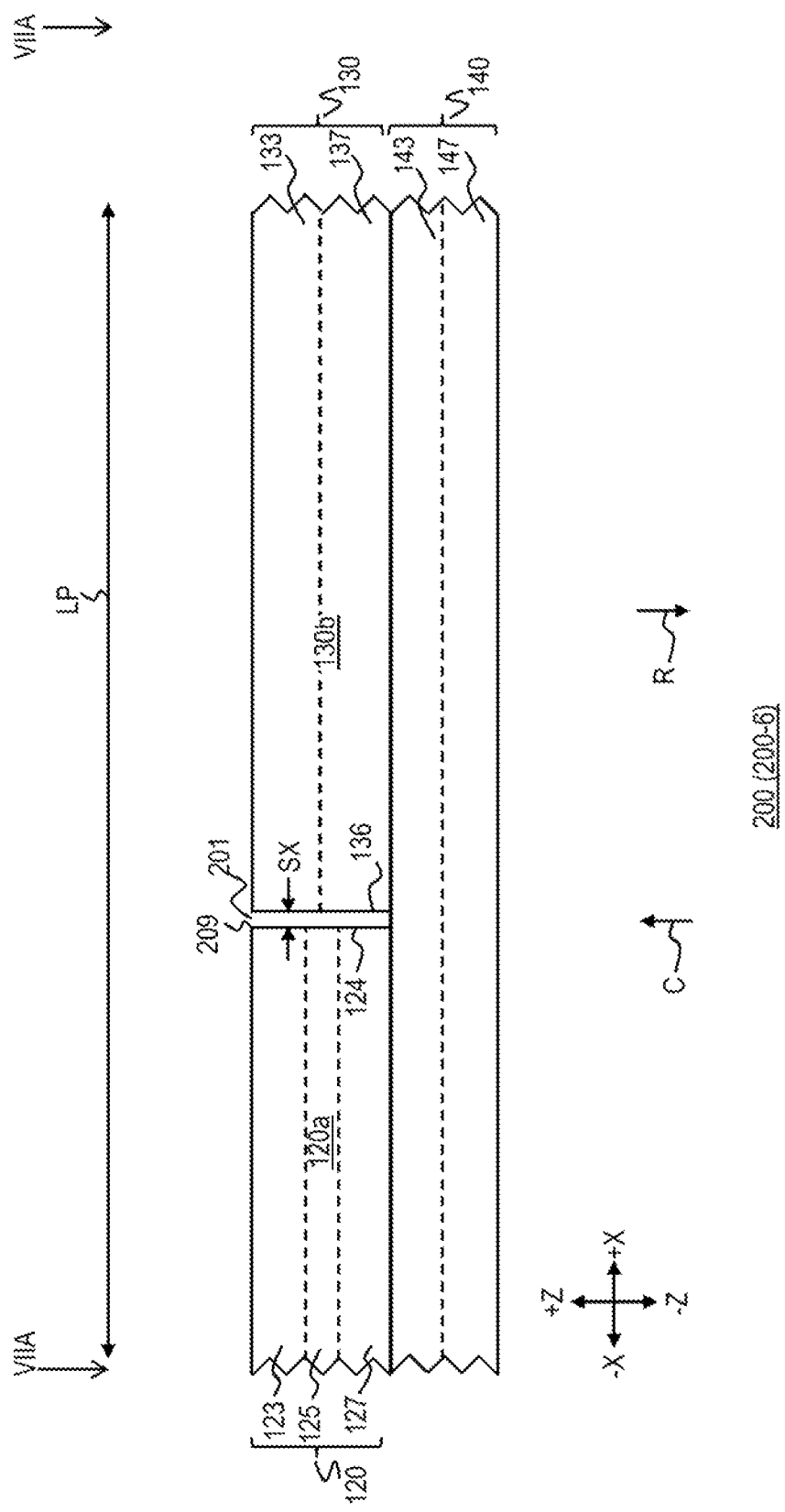
FIG. 7 is a cross-sectional view, similar to FIGS. 1, 2, 3, 4, 5, and 6, of a portion of the material stack of FIGS. 2-6, in a sixth stage of assembly of the shield structure of the assembly of FIG. 1, taken from line VII-VII of FIG. 7A.
Figure 7A:
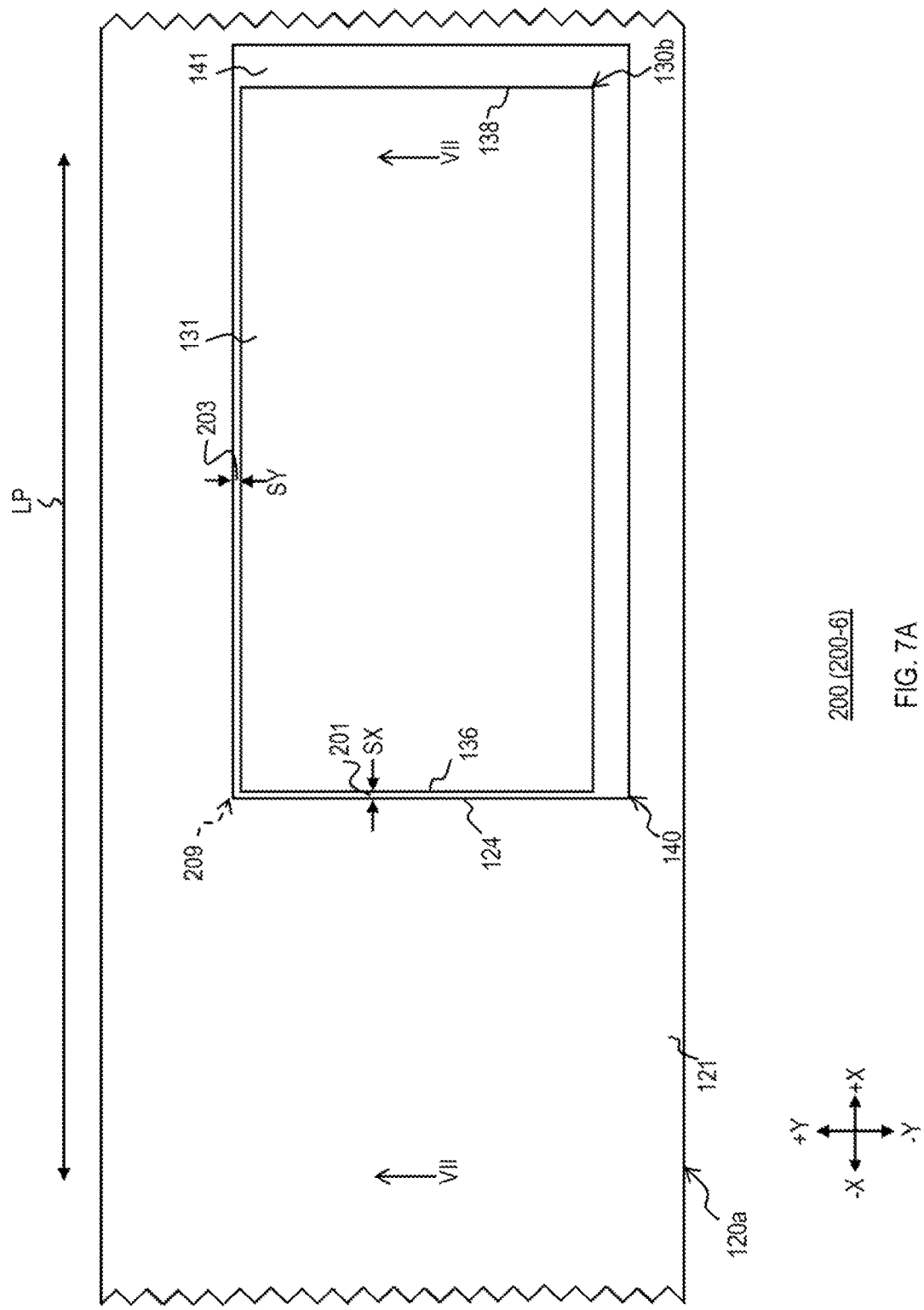
FIG. 7A is a top view, similar to FIGS. 2A and 3A, of a portion of the material stack of FIGS. 2-7, taken from line VIIA-VIIA of FIG. 7.

Once a base component (e.g., shield component 140) has been attached to stack 200 in fourth stage 200-4 to provide fifth stage 200-5 of stack 200, another portion of stack 200 may be removed from the stack in order to prepare the stack for use within assembly 100 as a shield structure. FIGS. 7 and 7A show stack 200 in a sixth stage of assembly of shield structure 102 (i.e., in a stage 200-6), which may be the same as stage 200-5 of stack 200 but after another portion of stack 200 has been removed through any suitable removal process. For example, as shown, carrier component 220 and first component portion 130a of insulation component 130 and first component portion 240a of buffer component 240 and first component portion 260a of liner component 260 may be removed (e.g., in the removal direction of arrow C) from the remainder of stack 200 of stage 200-5, such that adhesive layer 123 of top surface 121 of first component portion 120a of insulation component 120 may be exposed and such that substrate layer 133 of top surface 131 of second component portion 130b of insulation component 130 may be exposed. The stack portion removal process for providing stage 200-6 may be accomplished using any suitable technique(s), including any suitable scraping process. Removal of carrier component 220 and first component portion 130a of insulation component 130 and first component portion 240a of buffer component 240 and first component portion 260a of liner component 260 may be accomplished without affecting the geometry of the remaining stack portion. Stack 200 may be configured such that the release force required (e.g., in the direction of arrow C) to remove first component portion 260a of liner component 260 from first component portion 120a of insulation component 120 may be less than the release force required (e.g., in the direction of arrow C) to remove first component portion 120a of insulation component 120 from shield component 140, such that first component portion 120a of insulation component 120 may remain as a portion of stack 200 of stage 200-6 despite that first component portion 120a being stacked below the stack portion that was removed from stack 200 (e.g., the release force that may be required to release adhesive layer 127 of bottom surface 129 of first component portion 120a of insulation component 120 from top surface 141 of shield component 140 may be greater than the release force that may be required to release releasing agent layer 267 of bottom surface 269 of first component portion 260a of liner component 260 from adhesive layer 123 of top surface 121 of first component portion 120a of insulation component 120). Additionally, stack 200 may be configured such that the release force required (e.g., in the direction of arrow C) to remove carrier component 220 from second component portion 130b of insulation component 130 may be less than the release force required (e.g., in the direction of arrow C) to remove second component portion 130b of insulation component 130 from shield component 140, such that second component portion 130b of insulation component 130 may remain as a portion of stack 200 of stage 200-6 despite that second component portion 130b being stacked below the stack portion that was removed from stack 200 (e.g., the release force that may be required to release adhesive layer 137 of bottom surface 139 of second component portion 130b of insulation component 130 from top surface 141 of shield component 140 may be greater than the release force that may be required to release adhesive layer 227 of bottom surface 229 of carrier component 220 from substrate layer 133 of top surface 131 of second component portion 130b of insulation component 130). Carrier component 220 may be configured such that adhesive layer 227 may be permanently adhered to substrate layer 223 or at least have a very strong adhesion to substrate layer 223 (e.g., by cleaning and activating a bottom surface of substrate layer 223 before coating that bottom surface with a proper formulation of adhesive layer 227 to maximize such adhesion), while adhesive layer 227 may be configured to weakly adhere to substrate layer 133 of insulation component 130 (e.g., an adhesion weaker than the adhesion of adhesive layer 227 to substrate layer 223), where such adhesion may be stable along heat soak aging. The remaining structure of stage 200-6 may provide spacing 201 of magnitude SX between exposed side surface 124 of first component portion 120a of first insulation component 120 and exposed side surface 136 of second component portion 130b of second insulation component 130, where magnitude SX may be less than a particular magnitude (e.g., less than 80 micrometers, or less than 50 micrometers, or less than 30 micrometers, or less than 20 micrometers, or less than 10 micrometers).

As shown in FIG. 7A, horizontal cross-section cut shape 209s of cut 209 may provide a structure of stage 200-6 of stack 200 that may expose not only top surface 121 of first component portion 120a of insulation component 120 and top surface 131 of second component portion 130b of insulation component 130, but also a portion of top surface 141 of shield component 140. While the exposed portion of top surface 141 of shield component 140 may be limited to magnitude SX of spacing 201 between exposed side surface 124 of first component portion 120a of first insulation component 120 and exposed side surface 136 of second component portion 130b of second insulation component 130 (e.g., surfaces extending in Y-Z planes), and to a similar magnitude SY of a spacing 203 between other exposed side surfaces of first insulation component 120 and second insulation component 130 (e.g., surfaces extending in X-Z planes), an additional exposed portion of top surface 141 of shield component 140 may be exposed by the portion of cut shape 209s that may have been provided through a portion of stack 200 that does not include component 130 (if such a result is desired). Nevertheless, stage 200-6 of stack 200 may provide the reduced spacing between adjacent insulation components 120 and 130 along top surface 141 of shield component 140. Stage 200-6 of stack 200 may then be provided within assembly 100 of FIG. 1 for providing at least a portion of insulated shield structure 102. In some embodiments, a top surface of substrate layer 133 may be provided with an adhesive for adhering insulation component 130 to bottom surface 119 of assembly structure 110 within assembly 100. In other embodiments, the top surface of substrate layer 133 may not include an adhesive and/or component 130 may not be adhered to assembly structure 110 within assembly 100.

Figure 8:
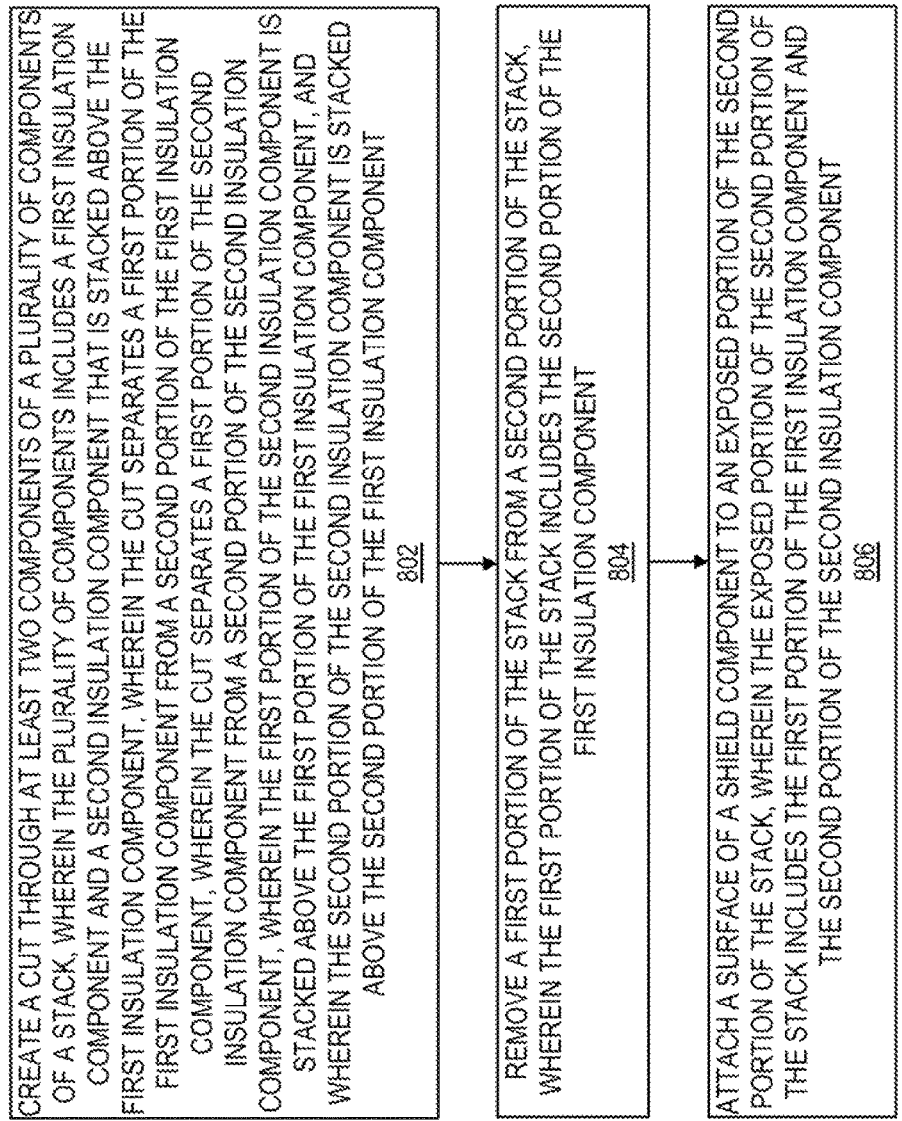
FIGS. 8 and 9 are flowcharts of illustrative processes for manufacturing a shield structure.

FIG. 8 is a flowchart of an illustrative process 800 for forming an insulated shield structure (e.g., shield structure 102 or stage 200-6 of stack 200) for an electronic device (e.g., assembly 100) using a shield component (e.g., shield component 140) and a stack (e.g., stage 200-1 of stack 200) that includes a number of components including a first insulation component (e.g., insulation component 120) and a second insulation component (e.g., insulation component 130) that is stacked above the first insulation component. At operation 802 of process 800, a cut (e.g., cut 209) may be created through at least two components of the stack (e.g., stage 200-1 of stack 200), wherein the cut separates a first portion of the first insulation component (e.g., first component portion 120a) from a second portion of the first insulation component (e.g., second component portion 120b), wherein the cut separates a first portion of the second insulation component (e.g., first component portion 130a) from a second portion of the second insulation component (e.g., second component portion 130b), wherein the first portion of the second insulation component (e.g., first component portion 130a) is stacked above the first portion of the first insulation component (e.g., first component portion 120a), and wherein the second portion of the second insulation component (e.g., second component portion 130b) is stacked above the second portion of the first insulation component (e.g., second component portion 120b). At operation 804 of process 800, a first portion of the stack may be removed from a second portion of the stack, wherein the first portion of the stack includes the second portion of the first insulation component (e.g., second component portion 120b). At operation 806 of process 800, a surface of the shield component (e.g., top surface 141 of shield component 140) may be attached to an exposed portion of the second portion of the stack, wherein the exposed portion of the second portion of the stack includes the first portion of the first insulation component (e.g., first component portion 120a) and the second portion of the second insulation component (e.g., second component portion 130b).

It is understood that the operations shown in process 800 of FIG. 8 are only illustrative and that existing operations may be modified or omitted, additional operations may be added, and the order of certain operations may be altered.

Figure 9:
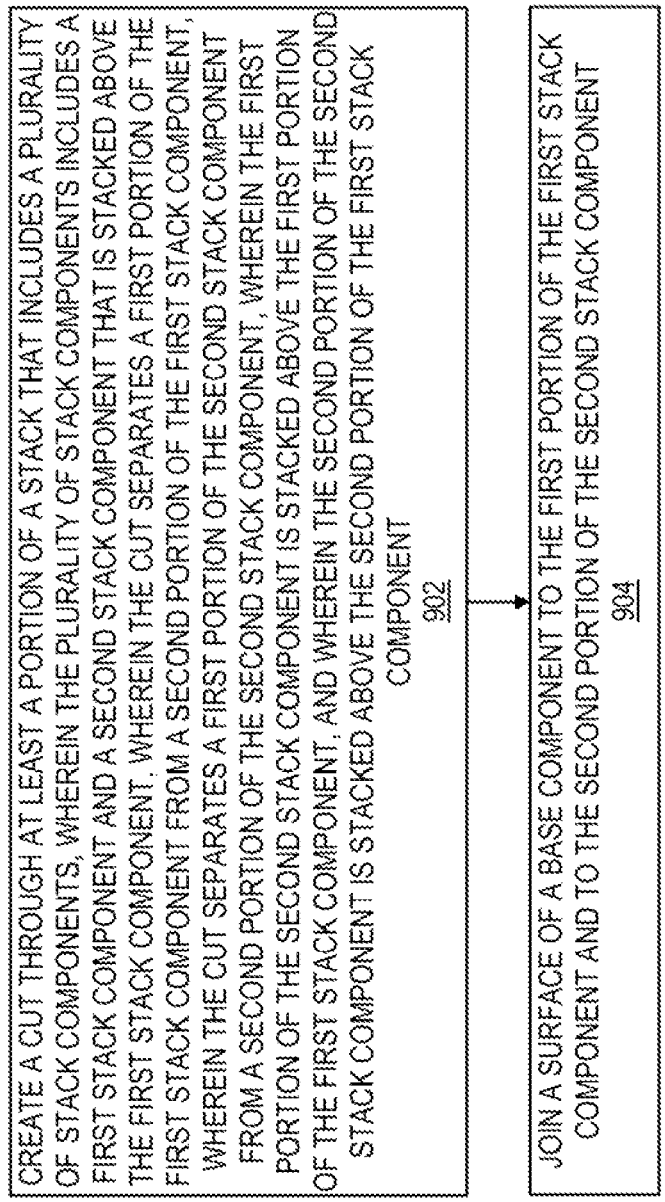

FIG. 9 is a flowchart of an illustrative process 900 for forming a multi-component structure (e.g., structure 102 or stage 200-6 of stack 200) using a base component (e.g., component 140) and a stack (e.g., stage 200-1 of stack 200) that includes a number of stack components including a first stack component (e.g., component 120) and a second stack component (e.g., component 130) that is stacked above the first stack component. At operation 902 of process 900, a cut (e.g., cut 209) may be created through at least a portion of the stack (e.g., stage 200-1 of stack 200), wherein the cut separates a first portion of the first stack component (e.g., first component portion 120a) from a second portion of the first stack component (e.g., second component portion 120b), wherein the cut separates a first portion of the second stack component (e.g., first component portion 130a) from a second portion of the second stack component (e.g., second component portion 130b), wherein the first portion of the second stack component (e.g., first component portion 130a) is stacked above the first portion of the first stack component (e.g., first component portion 120a), and wherein the second portion of the second stack component (e.g., second component portion 130b) is stacked above the second portion of the first stack component (e.g., second component portion 120b). At operation 904 of process 900, a surface of the base component (e.g., surface 141 of component 140) may be joined to the first portion of the first stack component (e.g., first component portion 120a) and to the second portion of the second stack component (e.g., second component portion 130b).

It is understood that the operations shown in process 900 of FIG. 9 are only illustrative and that existing operations may be modified or omitted, additional operations may be added, and the order of certain operations may be altered.

While there have been described shield structures with reduced spacing between adjacent insulation components and systems and methods for making the same, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms, such as "up" and "down," "front" and "back," "top" and "bottom" and "side," "above" and "below," "length" and "width" and "thickness" and "diameter" and "cross-section" and "longitudinal," "X-" and "Y-" and "Z-," and the like, may be used herein only for convenience, and that no fixed or absolute directional or orientational limitations are intended by the use of these terms. For example, the components of the shield structure can have any desired orientation. If reoriented, different directional or orientational terms may need to be used in their description, but that will not alter their fundamental nature as within the scope and spirit of the invention.

Therefore, those skilled in the art will appreciate that the invention can be practiced by other than the described embodiments, which are presented for purposes of illustration rather than of limitation.

What is claimed is:

1. A method of forming an insulated shield structure for an electronic device using a shield component and a stack that comprises a plurality of components, wherein the plurality of components comprises a first insulation component and a second insulation component that is stacked above the first insulation component, the method comprising:
   creating a cut through at least two components of the plurality of components of the stack, wherein:
      the cut separates a first portion of the first insulation component from a second portion of the first insulation component;
      the cut separates a first portion of the second insulation component from a second portion of the second insulation component;
      the first portion of the second insulation component is stacked above the first portion of the first insulation component; and
      the second portion of the second insulation component is stacked above the second portion of the first insulation component;
   removing a first portion of the stack from a second portion of the stack, wherein the first portion of the stack comprises the second portion of the first insulation component; and
   attaching a surface of the shield component to an exposed portion of the second portion of the stack, wherein the exposed portion of the second portion of the stack comprises:
      the first portion of the first insulation component; and
      the second portion of the second insulation component.

2. The method of claim 1, wherein, after the attaching, a spacing between an exposed side surface of the first portion of the first insulation component and an exposed side surface of the second portion of the second insulation component is less than 80 micrometers.

3. The method of claim 1, wherein, after the attaching, a spacing between an exposed side surface of the first portion of the first insulation component and an exposed side surface of the second portion of the second insulation component is less than 50 micrometers.

4. The method of claim 1, wherein, after the attaching, a spacing between an exposed side surface of the first portion of the first insulation component and an exposed side surface of the second portion of the second insulation component is less than 30 micrometers.

5. The method of claim 1, wherein the attaching comprises:
   pressing a first portion of the surface of the shield component against the first portion of the first insulation component of the exposed portion of the second portion of the stack; and
   pressing a second portion of the surface of the shield component against the second portion of the second insulation component of the exposed portion of the second portion of the stack.

6. The method of claim 5, wherein the attaching is a single laminating operation.

7. The method of claim 1, wherein the attaching is a single laminating operation.

8. The method of claim 1, wherein the plurality of components of the stack further comprises a buffer component that is stacked between the first insulation component and the second insulation component.

9. The method of claim 1, wherein:
   the first insulation component comprises a pressure sensitive adhesive; and
   the second insulation component comprises a polyimide adhesive.

10. The method of claim 9, wherein:
    the plurality of components of the stack further comprises a buffer component that is stacked between the first insulation component and the second insulation component;
    the buffer component comprises:
       a substrate layer;
       a releasing agent layer along a first surface of the substrate layer that faces the second insulation component in the stack; and
       an adhesive layer along a second surface of the substrate layer that faces the first insulation component in the stack.

11. A method of forming a multi-component structure using a base component and a stack that comprises a plurality of stack components, wherein the plurality of stack components comprises a first stack component and a second stack component that is stacked above the first stack component, the method comprising:
    creating a cut through at least a portion of the stack, wherein:

the cut separates a first portion of the first stack component from a second portion of the first stack component;

the cut separates a first portion of the second stack component from a second portion of the second stack component;

the first portion of the second stack component is stacked above the first portion of the first stack component; and the second portion of the second stack component is stacked above the second portion of the first stack component; and joining a surface of the base component to:
the first portion of the first stack component; and
the second portion of the second stack component.

12. The method of claim 11, wherein, after the joining, a spacing between an exposed surface of the first portion of the first stack component and an exposed surface of the second portion of the second stack component is less than 50 micrometers.

13. The method of claim 11, wherein the joining is a single lamination operation.

\* \* \* \* \*